United States Patent
Bloom et al.

(10) Patent No.: US 6,675,310 B1
(45) Date of Patent: Jan. 6, 2004

(54) COMBINED WAVEFORM AND DATA ENTRY APPARATUS AND METHOD FOR FACILITATING FAST BEHAVORIAL VERIFICATION OF DIGITAL HARDWARE DESIGNS

(75) Inventors: Andrew Maurice Bloom, Plantation, FL (US); Rodrigo Jose Escoto, Plantation, FL (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/564,730

(22) Filed: May 4, 2000

(51) Int. Cl.[7] ................................. G06F 1/04
(52) U.S. Cl. ..................... 713/500; 713/400; 716/6
(58) Field of Search .................. 713/400, 500, 713/501, 503, 600; 716/1, 3, 4, 6, 18

(56) References Cited

U.S. PATENT DOCUMENTS

| 5,353,433 | A | * | 10/1994 | Sherman | 713/600 |
|---|---|---|---|---|---|
| 5,381,524 | A | | 1/1995 | Lewis | |
| 5,657,437 | A | | 8/1997 | Bishop | |
| 5,790,435 | A | | 8/1998 | Lewis | |
| 5,893,123 | A | | 4/1999 | Tuinenga | |
| 5,896,301 | A | * | 4/1999 | Barrientos | 716/8 |
| 6,181,320 | B1 | * | 1/2001 | Fredrickson | 345/440 |
| 6,324,678 | B1 | * | 11/2001 | Dangelo et al. | 716/18 |
| 6,453,450 | B1 | * | 9/2002 | Walter | 716/6 |
| 6,513,143 | B1 | * | 1/2003 | Bloom et al. | 716/3 |

* cited by examiner

*Primary Examiner*—Dennis M. Butler
(74) *Attorney, Agent, or Firm*—Malin Haley & DiMaggio; H. C. Chan

(57) ABSTRACT

A computer implemented apparatus and method that automates the entry, modification, analysis, and generation of test benches from electrical circuits, both of which are specified as hardware description language (HDL) files. The computer implemented-method and apparatus also provides a unique mechanism that blends entry and display of timing requirements that must be met by the electric circuit.

27 Claims, 9 Drawing Sheets

COMBINED WAVEFORM AND DATA ENTRY APPARATUS AND METHOD FOR FACILITATING FAST BEHAVORIAL VERIFICATION OF DIGITAL HARDWARE DESIGNS

BACKGROUND OF THE INVENTION

1. Field of the Invention

The invention relates to an electrical circuit timing and verification system, and particularly to a computer-based system that automates and facilitates the entry, modification, analysis and generation of test benches in multiple HDL digital hardware designs via a unique wavetable spreadsheet interface which simultaneously displays data as both waveforms and numerical cell values.

2. Description of Related Art

Hardware Description Languages (HDLs) are language specifications for precisely describing the behavior and programming the function of electrical circuits. Test benches are HDL descriptions specialized in describing and verifying the behavior of electrical circuits.

Events and data in electrical circuits are routinely described by signals (one bit wide), and vectors (two or more bits wide). The manner in which signals and vectors change as time flows are described by displaying signal snapshots sequentially. The resulting object is called a waveform.

If signal waveforms are not properly synchronized, the electrical circuit may not behave as intended, and consequently generate unwanted operational errors.

When a circuit is built, an engineer will use timing verification techniques to identify such errors such that they can be eliminated.

One popular timing verification technique is the creation of timing waveforms to describe the logical relationships, values, and timing constraints among the signals in a given electrical circuit.

A technique for testing the behavior of electrical circuits under arbitrary and specific input data streams are also needed to detect data sensitive errors. Spreadsheet-based tables of signal data streams stacked on top of each other are commonly used to spot data-sensitive errors. However, because table-based descriptions of data lacks visual content, it is inherently ill suited to convey the logical relationship among the same data. These tables are usually generated manually via programming scripts of varying complexity.

HDL simulators are typically used to test and visualize all the various logical and physical conditions that will influence the behavior and proper function of an electrical circuit.

A problem with simulators is that they cannot be used until the behavioral description of the design has been properly and manually encoded as a script or as an HDL test bench description. This in itself is an error-prone and tedious process.

Likewise, HDL test bench descriptions of test pattern data are, by themselves, static, thereby requiring considerable effort to modify in response to changes in the underlying electrical circuit specification.

Another problem with traditional simulators is that, once a problem is encountered, the test pattern must be modified manually in order to keep it up to date.

Thus, it is highly desirable to create a "seamless" two-way link between the HDL description of the electrical circuit, and the test pattern used to verify it.

Furthermore, in a truly seamless test environment, changes in the specification of the circuit interface to the outside world would have to be automatically reflected in the test pattern itself. Were this not the case, any HDL test bench description generated from the test pattern would no longer correctly reflect the user's intent.

Because HDL test benches are the standard format used by engineers to test designs with HDL simulators, there is a need for automating their entry, modification, and generation, resulting in HDL descriptions that are both quantitatively and qualitatively correct.

The present invention also addresses the problem which arises when an HDL design (VHDL or VERILOG®, or other HDLs) is synthesized to a HDL netlist and the resulting netlist may not be compatible with test benches created for the pre-synthesis HDL source. The most common reasons for this are:

1) Unused inputs are optimized out during synthesis, and therefore not present in the port list;
2) A signal is defined as bi-directional (inout, buffer) in the HDL source, but is used only as an output. Synthesis correctly recognizes the signal is uni-directional and changes the port mode from bi-directional to uni-directional;
3) Complex data types are remapped to synthesized types. An example is in VHDL the INTEGER data type is remapped to std_logic_vector; or
4) Parameters (VERILOG®) and Generics (VHDL) are used pre-synthesis to set up the design. Once synthesized, these are dropped from the port definition. Pre-synthesis test benches must instantiate the design using the parameter for it to function as intended. Post-synthesis designs have been flattened, and no parameters remain in the ports; or
5) Partially used vectors (those with some unused bits) are changed in width; or
6) The order of signals in the port is changed, thereby causing test benches which rely on port order for instantiation to be incompatible.

The net result is that the test engineer needs to modify all test benches to accommodate to the changes. The designer needs to update all port definitions, component instantiations, signal assignments, and output assertions. Each time changes are made to the pre-synthesis design (then synthesized) the test benches need to be re-updated to maintain consistency.

For example, pre-synthesis VHDL definition for a counter might look like the following:

```
entity counter is
    Port (
        CLK : in std_logic;
        RESET : in std_logic;
        CE : in std_logic;
        COUNT : inout integer range 0 to 7 := 0
    );
end counter;
```

After synthesis, the VHDL netlist ports look like this:

```
entity COUNTER is
    port (
        CE : in STD_LOGIC := 'X';
        CLK : in STD_LOGIC := 'X';
        RESET : in STD_LOGIC := 'X';
        COUNT : out STD_LOGIC_VECTOR ( 2 downto 0 )
    );
end COUNTER;
```

Notice the last item (COUNT) in the pre-synthesis definition is:

COUNT: inout integer range 0 to 7:=0

In this case the counter is of mode "inout" and is of type "integer".

After synthesis it becomes:

COUNT: out STD_LOGIC_VECTOR (2 downto 0)

Notice the mode is now "out" and the type is "std_logic_vector".

The changes made during synthesis render the pre-synthesis (behavioral) test benches unusable without modification. Normally the test benches must be updated by hand. All ports must be updated to match the synthesized netlist. Generics (and parameters) must be eliminated. Unused signals must be stripped from the port and the test bench. The test bench code must then be revised, changing all input assignments, check procedures, file IO and other portions of the test bench which are affected by signal definition changes and port changes.

During simulation and synthesis of behavioral designs, attributes are passed to the unit under test via generics or parameters. These attributes can be changed in the behavioral description. The last value assumed by the generics must be used during the remap process to ensure continuity between behavioral and post-synthesis testing.

One solution to this problem is to restrict the HDL constructs used in a design. For example, allowing only std_logic_vectors in place of integers might eliminate data type remapping. Port mode changes can be resolved (manually) by back annotating the synthesized port modes into the original behavioral HDL source. While these solutions reduce the occurrences of port map problems, they do not eliminate them.

The present invention addresses this problem by including an Automatic Post Synthesis Test Bench Remap feature that automatically re-maps signals based upon their name, mode and data type.

BRIEF SUMMARY OF THE INVENTION

A computer-based system, which automates and facilitates the entry, modification, analysis and generation of HDL test benches from standard HDL description code.

The present invention utilizes a unique combined waveform- and table data entry system to facilitate fast behavioral verification of digital hardware circuit designs. A cell based, tabular data entry system consists of rows of signal names and columns of cell values containing time-varying data, which are displayed as waveforms.

The present invention allows the user to enter data in a way similar to data entry in standard spreadsheets, as well as editing values by the use of a click event. The data values are represented by both waveforms and cell values, which are shown using dynamic text compression to reduce the viewing space required to see the values. Redundant values are hidden, and constant values are maintained until another value is assigned.

Each cell is partitioned into two distinct phases, input and output. Data entered for a particular signal is automatically entered into the correct portion of the column, automatically setting up the correct timing. Bi-directional signals are allowed two entries per column, one input entry and one output entry. To clarify each column's time relevance, a color-coding scheme is used. Light blue represents input cells while yellow is used to represent output cells. Gray represents disabled times. An attempt to toggle bits or invoke the invention's cell editor in a disabled time region automatically makes the change in the preceding active time cell, guaranteeing correct entry 100% of the time.

The system and method of the present invention are for use with arbitrary HDL source code descriptions of electrical circuits and with external HDL simulators. The system comprises: (1) an HDL input editor, for dynamically retrieving, viewing and modifying arbitrary HDL descriptions of electrical circuits; (2) a scanning interface, which retrieves specific circuit sub-components to test (unit under test, or UUT) from arbitrary HDL descriptions; (3) a time scaling unit, which specifies basic timing parameters that must be met during normal circuit operation; (4) a wavetable editor, for dynamically viewing, creating and modifying test patterns; (5) a wavetable-to-test bench translation unit, which generates HDL behavioral descriptions (test benches) of the test pattern in the wavetable unit; (6) a back annotation unit which updates waveforms with simulation results, or highlights simulation errors; and (7) a remap unit which updates the waveforms upon source HDL port changes or reassociation with post-synthesis source HDL.

The Wavetable editor seamlessly blends waveform signals, pattern data and the interface specified by the underlying HDL description. Waveform signals can be altered at specific points in time simply by clicking on their background cells, or through regions of arbitrary size through a pattern generator.

The HDL Editor and the wavetable Editor contain two-way links, which allows them to maintain consistency and coherency between the test pattern under development and the input/output interface of the UUT.

Similarly, the time scaling unit has a one-way link to the wavetable editor, which allows it to modify the entire test pattern under development so that it conforms to changing requirements for the electrical circuit being tested.

The wavetable-to-test bench translation unit automatically generates HDL test bench specifications fully compatible with most HDL compliant simulators, thereby seamlessly linking arbitrary HDL descriptions of electrical circuits with the simulators needed to test them.

Finally, the back-annotation unit, which takes simulation results and updates the waveforms with the resultant values or highlights mismatches between actual and expected behavior.

Automatic Post Synthesis Test Bench Remap

The present invention also includes a feature titled, "Change HDL source". When a waveform description has been created for a HDL (pre-synthesis) design, the user can simply select the post-synthesis HDL netlist as the new source. The remap unit of the present invention automatically re-maps signals based on their name, mode, and data type. Unused signals are automatically dropped. The waveform can then be re-exported for post-synthesis simulation.

In the examples given above, the signal COUNT is automatically remapped with no user intervention. In the case where there may be possible conflicts, the present invention will ask the user for information such as which signal to re-map to, and how to resolve the new data type. If post-synthesis uses new data types not currently recognized, the remap unit of the present invention will automatically ask for information which will allow it to use the new types and remap the older type correctly.

To summarize, the present invention is a computer system for constructing HDL test benches based upon HDL descriptions of electrical circuits, comprising a means for generating and modifying HDL data descriptions; a computer, including a monitor and memory storage means containing instructions for displaying a spreadsheet comprised of timing waveforms superimposed on an array of cells containing time-varying signal data patterns, wherein the waveforms and the data patterns correspond to the HDL descriptions and are simultaneously displayed on the monitor; means for modifying the waveforms and the signal data patterns; and means for automatically translating the waveforms into a complete HDL test bench file, the test bench file being fully compatible with industry-standard HDL simulators.

In accordance with these and other objects that will become apparent hereinafter, the instant invention will now be described with particular reference to the accompanying drawings.

DETAILED DESCRIPTION OF THE INVENTION

In the following description of the preferred embodiment, reference is made to the accompanying drawings that form a part thereof, and in which is shown by way of a illustration a specific embodiment in which the invention may be practiced. It is to be understood that other embodiments may be utilized and structural changes may be made without departing from the scope of the present invention.

Figure 1:
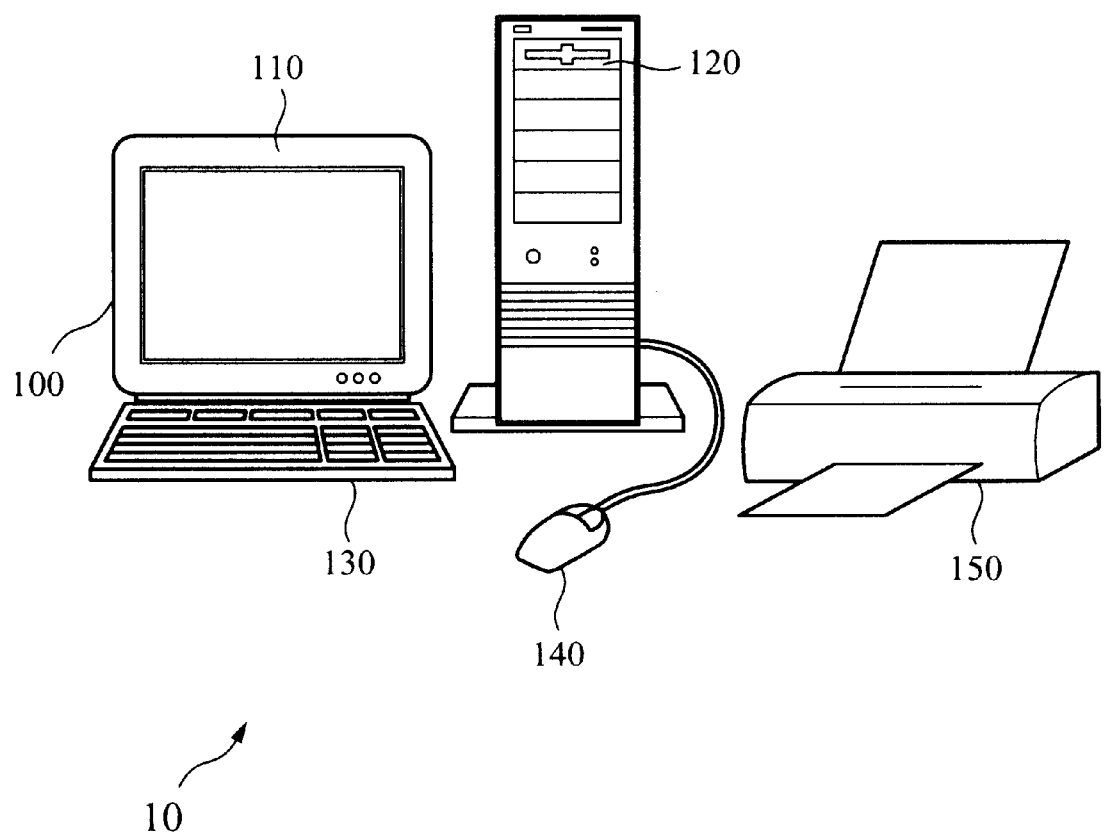
FIG. 1 shows a typical computer system utilizing the present invention.

Referring first to FIG. 1, a combined waveform and data entry system for facilitating fast behavioral verification of digital hardware designs is designated generally by the number 10 and comprises a personal computer (PC) 100 including a monitor 110, a disk storage device 120, input devices such as a keyboard 130 and a mouse 140 and printer peripherals 150. The preferred embodiment of the present invention runs under Microsoft Windows operating systems.

Figure 2:
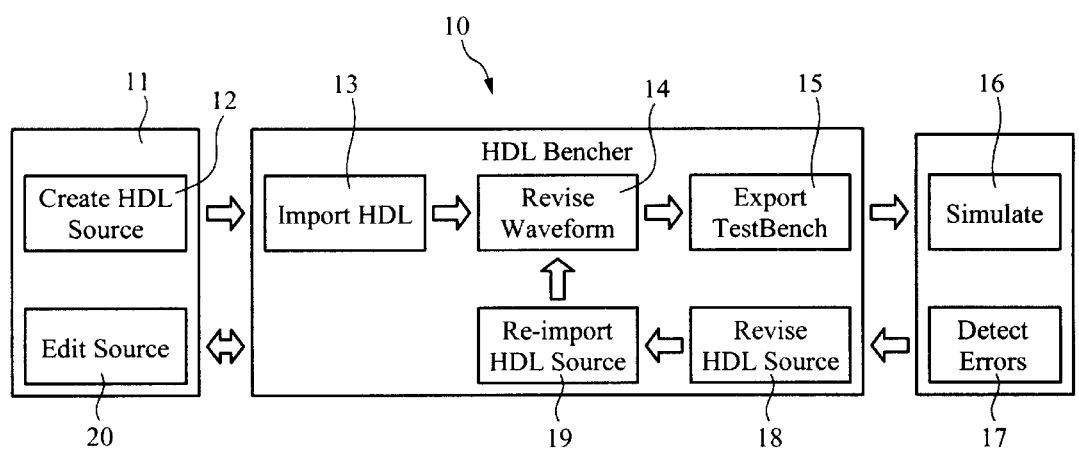
FIG. 2 shows a block diagram depicting the overall process flow of the test bench generating system of the present invention.

FIG. 2 shows the process flow used for developing test benches for arbitrary VHDL and VERILOG® designs utilizing the present invention.

The Text Editor 11 creates the HDL source code via step 12, which is subsequently imported 13. The system 10 revises the waveform 14 and a test bench exported 15 for simulation 16. After simulation, errors are detected 17 and the source code is revised via step 18. The source code is once again imported and the waveform revised 14 until the Text Editor edits the source code to correspond to the revised waveform.

The VHDL and VERILOG® test benches produced by the test bench generation system of the present invention 10 may be simulated using simulators from VIEWLOGIC®, SYNOPSYS®, MODEL TECHNOLOGY, and others. The resulting test bench is timing constrained, and can be used for post synthesis timing verification.

HDL sources created external to the invention can be read into the Text Editor, or new designs can be created within the Text Editor. Once an HDL source is read into the Text Editor, it can be imported. The waveforms are then revised and the test bench created and exported. After simulation, errors are detected, and the test bench and the HDL source code are revised and re-imported, automatically updating the waveform attributes with updated port attributes including width, direction, data type and name, to create an updated waveform which shows the simulation output or mismatches between actual and expected behavior. The test bench is automatically re-exported to comply with the changes. The need for manual test modification for each design revision has been eliminated.

Figure 3:
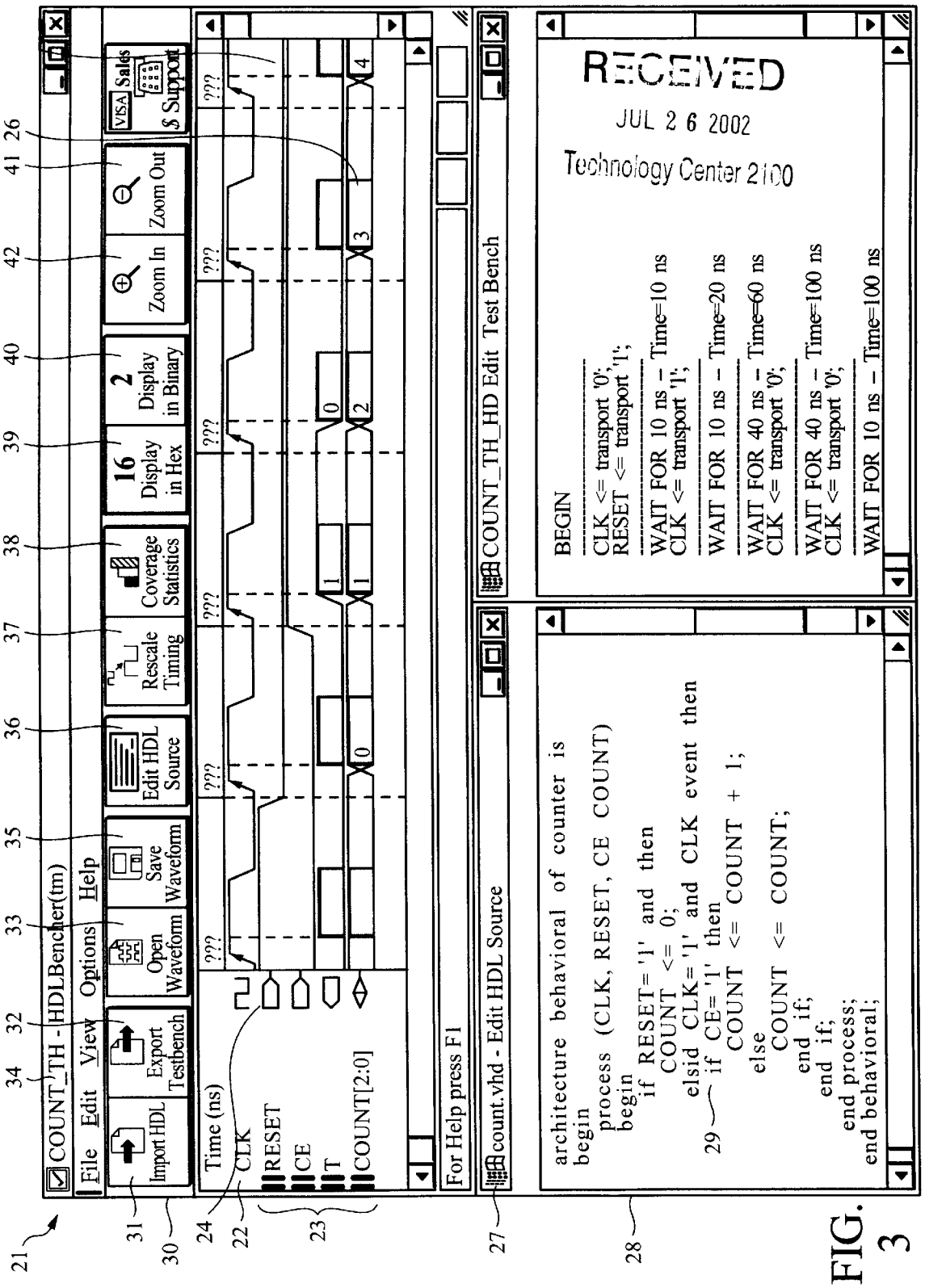
FIG. 3 illustrates a typical spreadsheet displayed by the present invention

Referring to FIG. 3, a window 21 showing a typical spreadsheet utilizing the present invention can be seen. The waveform window 22 provides waveforms which are displayed and edited. A color scheme is used wherein waveform window 22 is gray and the waveforms are colored according to IO mode, whether it be input, output or bi-directional. The color scheme ensures that waveforms are clearly recognizable and easily identified when selected.

Signal names 23 are represented in each row. The port direction 24 is also indicated to the right of each signal name. Signals are simultaneously presented in both waveform 25 and as numerical cell values 26.

The HDL being tested is indicated at 27 and the source code is shown below it in the source editor window 28. Source editor window 28 allows the source file associated with the test bench to be edited and viewed as test bench development proceeds. Source editor window 28 is automatically positioned beneath waveform window 22 whenever a design is imported or a waveform file is opened.

Text strings 29 are located in source editor window 28, facilitating design revision. Process bar 30 allows the user to select one of several editing, display, or statistical options.

When an Import command is executed via the Import HDL button 31, the user is able to quickly locate the target file to be tested. Files with .vhd, vhdl. And .vhf extensions as VHDL, and files with extensions .v and .vf as VERILOG® are automatically recognized. The user is queried as to which unit is to be tested.

Once the user indicates which unit is to be tested, the unit is analyzed for port problems such as syntax and semantic errors, and inconsistencies. The problems are detected, highlighted and a solution is suggested.

The HDL is further analyzed to determine if the design is clocked or combinatorial. The user is then prompted to select a default timing to be used in the test bench. The waveform is automatically initialized, the clock pattern is automatically set, waveforms are sorted by type, and inputs are assigned initial values.

Source editor window 28 is opened, and automatically scrolled to the unit under test. Upon completion of the waveform specification, the design may be exported to a VHDL or VERILOG® test bench. Export Testbench button

32 produces a timing constrained test bench which can be ultimately simulated on a third party VHDL or VERILOG® simulator. Executing Export Testbench button 32 causes the present invention to write a VERILOG® or VHDL testbench. The exported test bench is a complete test bench which includes all of the stimuli and assertions in the parent waveform.

Prior to exporting, all inputs are checked to see if they are assigned. If not, a warning is issued and prompts the user to initialize the inputs to avoid simulation problems, to allow the inputs to be initialized automatically.

Open Waveform button 33 allows waveforms to be read into the system for editing. Title bar 34 indicates the waveform file name, and window 21 shows the waveform. When the waveform is opened, the corresponding HDL source file is also opened and shown in editor window 28.

The user may save a current waveform by executing the Save Waveform command 35. This command writes the waveform diagram to the current file name as shown in title bar 34. The Edit HDL Source button 36 invokes the source editor and allows the source code to be edited.

The invention also automatically shows testing coverage, allowing the user to quickly identify unused portions of the design and to improve design reliability. The Coverage Statistics button 38 provides a summary of how much of the design has been exercised at any point in time. As a waveform is developed, coverage of each signal is shown via small bar graphs to the left of each signal's name. The coverage bar changes from red (untested) to green (tested). Moving the cursor over a bar causes a popup window to display the signal's coverage.

Values may be represented in hex, decimal, or binary form, via buttons 39 and 40 on the tool bar (the waveform shown in FIG. 3 is currently being displayed in decimal, therefore, no decimal button appears). If the radix is changed, all further usage of numbers assumes the new radix as the default.

Because larger waveforms cannot be shown on the screen at one time, the present invention includes a Zoom Out button 41 to allow viewing and editing of large test cases. Zoom In 42 provides further magnification.

Figure 4:
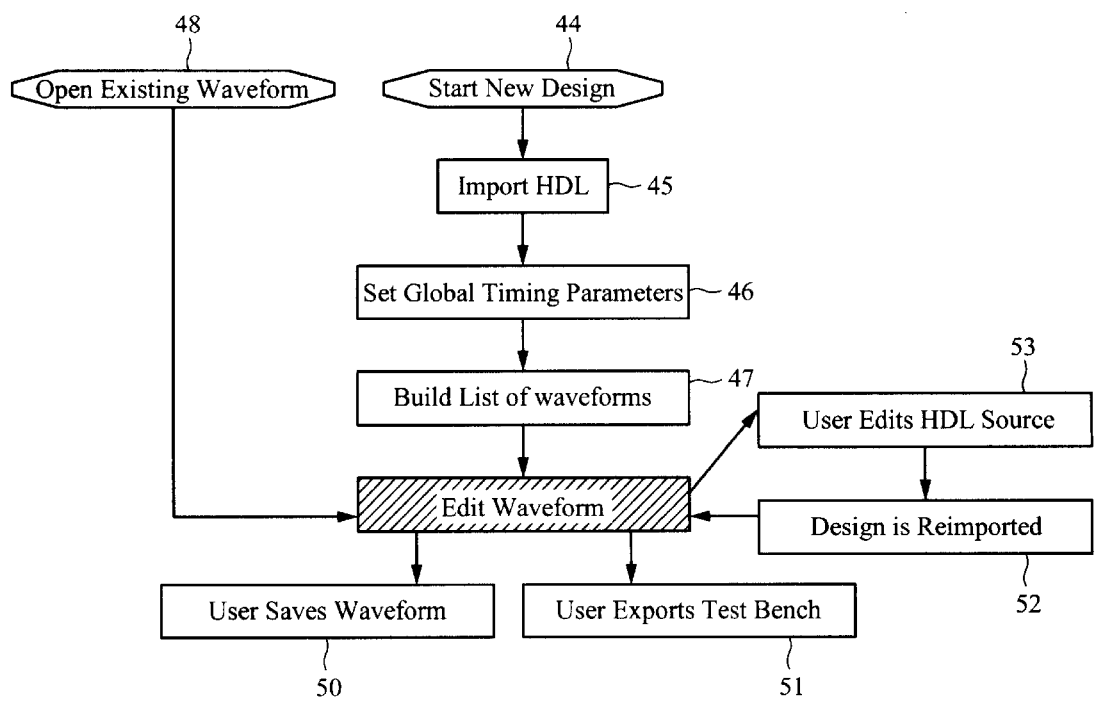
FIG. 4 shows a flowchart of the test bench generation process used by the present invention.

Referring to FIG. 4, the overall method of the test bench generation system of the present invention is shown in flowchart form. When a new electrical circuit design is to be tested 44, its corresponding HDL code is first imported 45 and the timing constraints and parameters are set via step 46. A set of waveforms is created 47, opened 48 and edited 49. The user then has the option of saving the waveform 50 and/or exporting the test bench 51. After simulation, the user can back re-import the design 52 into the wavetable with expected results after editing the HDL source code 53.

Figure 5:
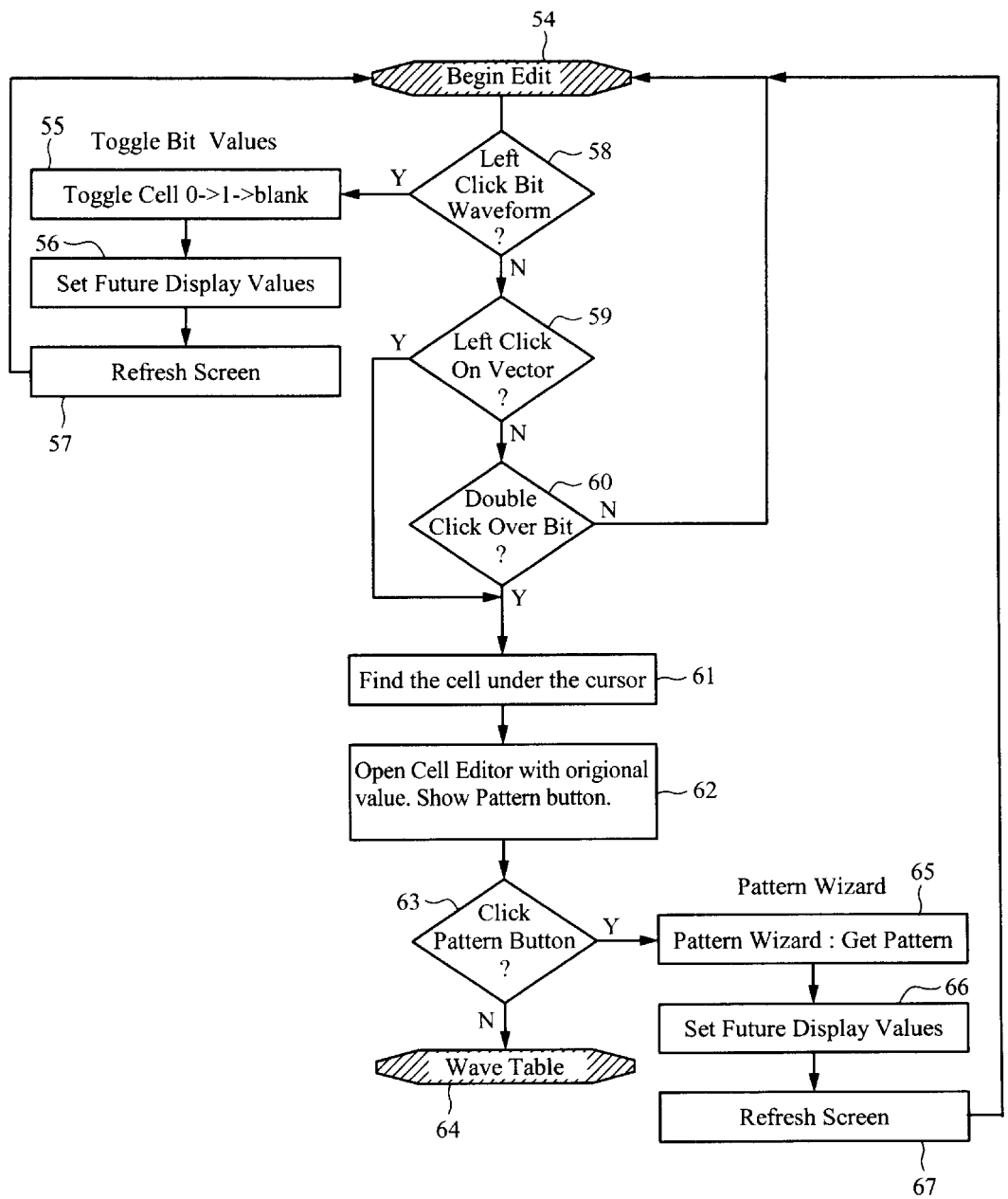
FIG. 5 shows a flowchart of the waveform editing process of the present invention.

Referring to FIG. 5, waveforms can be edited by invoking the waveform editor 54 of the present invention. If the user left clicks on the bit waveform itself 58, further clicks will toggle the cells from "0" to "1" to a blank cell 55. Future cell values can be set in this fashion 56 and the entire screen can be refreshed 57 to accommodate the changes.

Alternatively, by clicking on the vector 59 or by double clicking 60, the cell editor can be opened and a value can be manually entered, steps 61–64 or the Pattern Wizard invoked via steps 65–67.

Data values can be entered using a spreadsheet approach where cells are assigned specific values. The user can simply double click a signal at the specific location where it should be changed. The value editor appears and the value can be entered. After pressing the [ENTER] key, the cursor is automatically placed at the next time frame where the next cell can be edited in the same fashion. Windows standard graphics operators such as cut, copy, and paste are fully supported to facilitate waveform manipulation.

Figure 6:
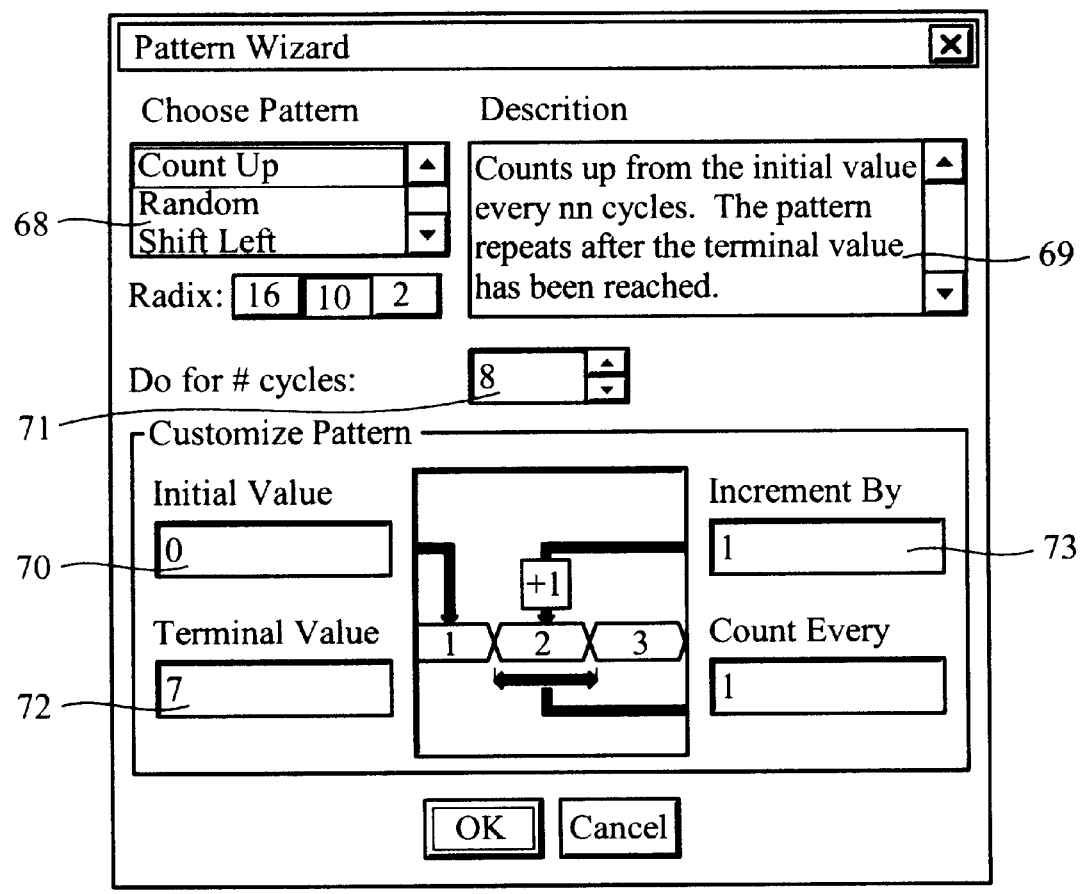
FIG. 6 shows a block diagram of the Pattern Wizard cell editing dialog box of the present invention.

Using the Pattern Wizard (FIG. 6) is an alternate method of waveform editing. Here, bit signals may be toggled, pulsed, or randomly assigned via the Choose Pattern box 68. Vectors can be counted, shifted or randomly assigned.

A user first can choose a pattern 68, and read the description of the specific pattern in the Description window 69. The pattern can be repeated for a given number of cycles 71, and a customized pattern can be created by entering the initial 70 and terminal values 72, and the amount of incrementation 73.

The present invention allows the user to specify timing constraints that must be met during post-synthesis verification via the Rescale Timing button 37 (FIG. 3). Timing parameters can be changed at any time, allowing test cases to be updated for faster devices.

Figure 7:
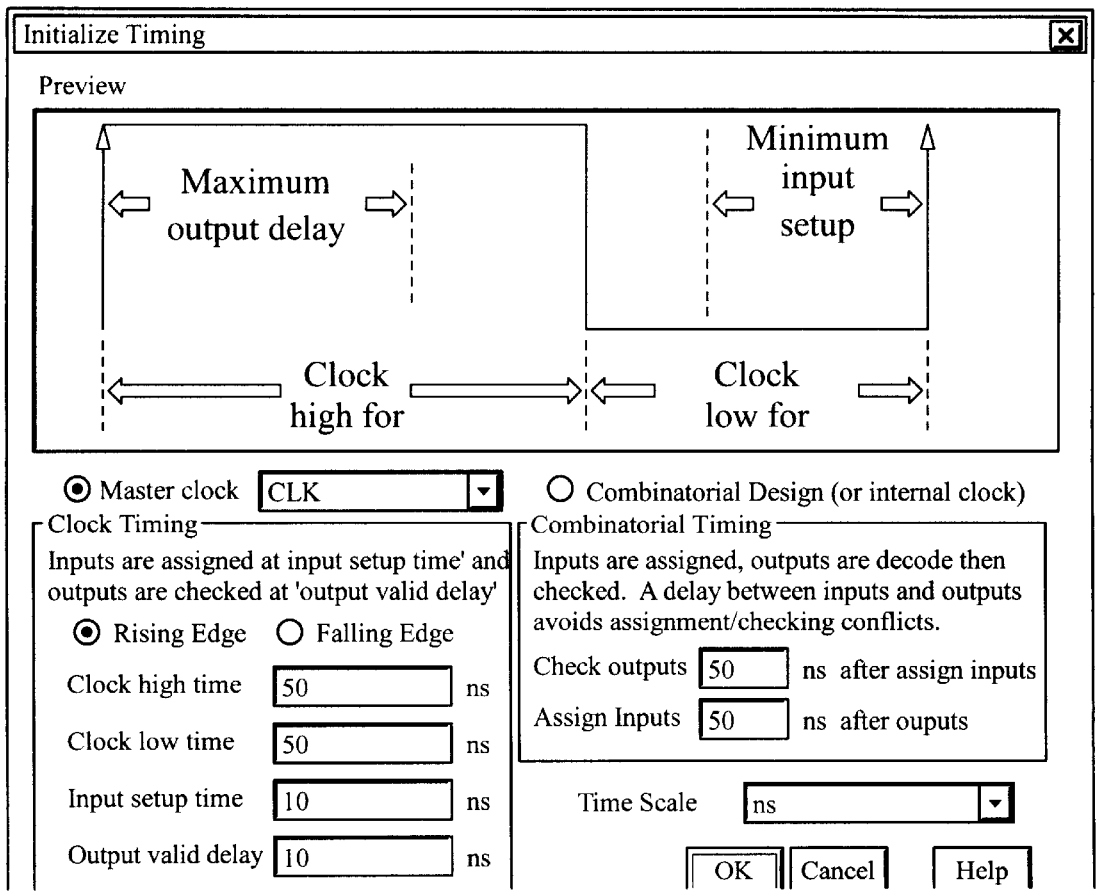
FIG. 7 shows the timing dialog box to allow the user to select timing parameters for imported designs.

When a design is imported, and the timing-editing feature is invoked, the user is automatically asked to choose a timing parameter (FIG. 7). The imported design is parsed to determine if it is clocked or combinatorial. The maximum output delay and minimum input setup time can be specified. The user simply selects the time units to be used during test benching from the Time scale list box. The duty cycle of the clock is specified by setting the Clock high time and Clock low time parameters.

The present invention outputs timing constrained VHDL/VERILOG® test benches which can be simulated on a third party simulator. By choosing a specific programmable device, the output can be used to see if the timing constraints are met after synthesis.

Post Synthesis Remap

Figure 8:
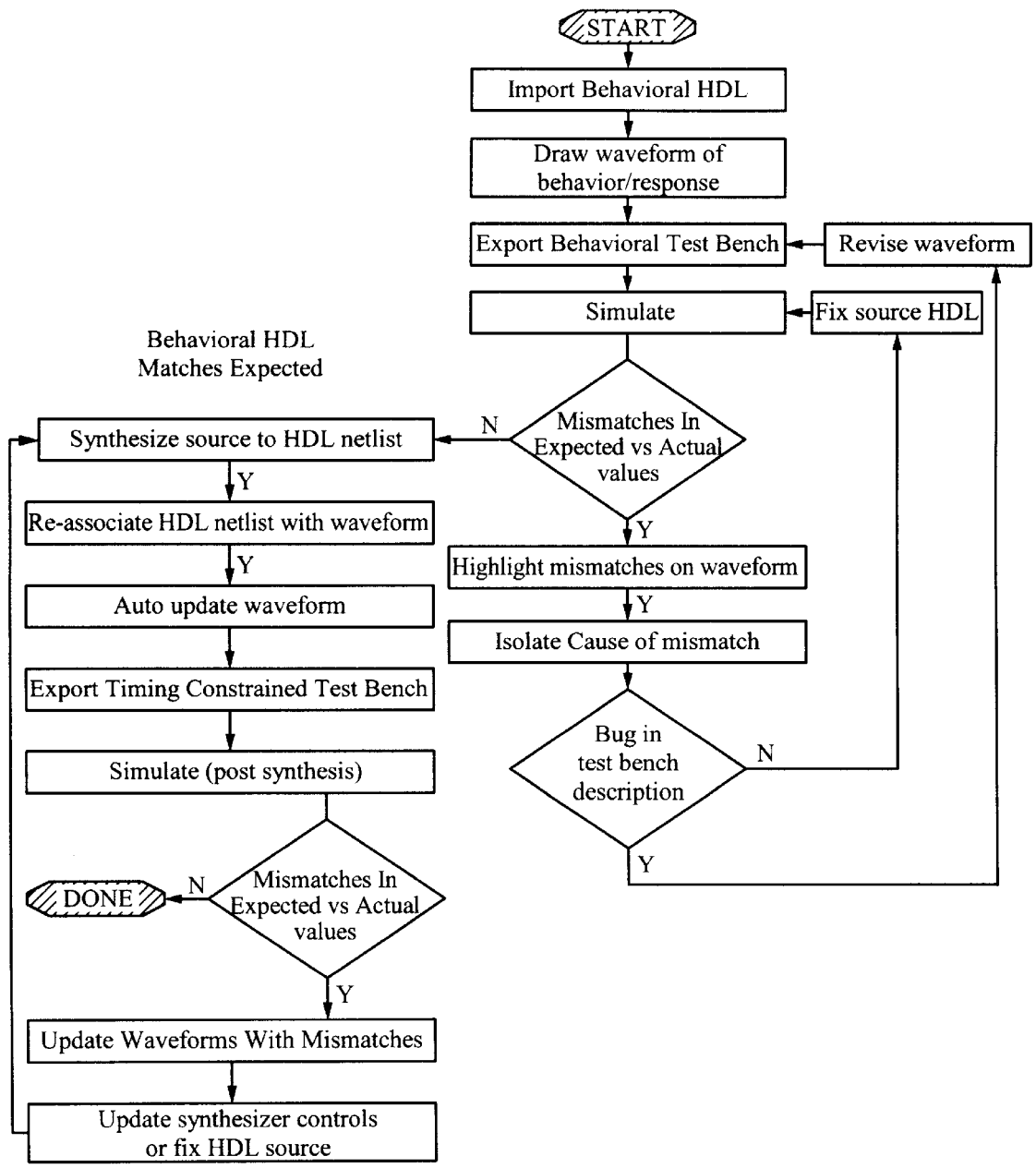
FIG. 8 illustrates, in a block diagram, the process to reassociate post-synthesis HDL netlist results with the waveform description as utilized in the present invention.
Figure 9:
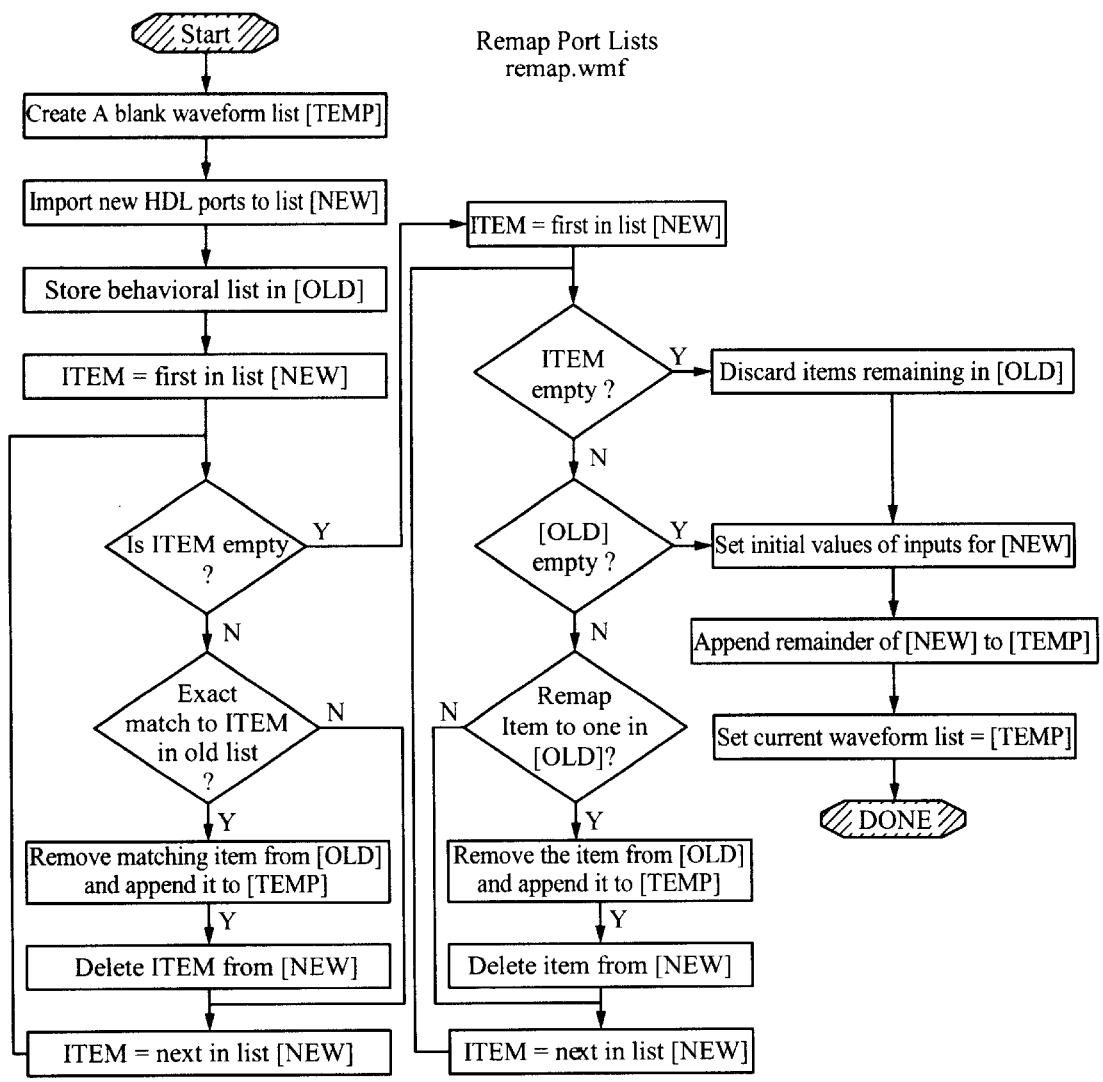
FIG. 9 depicts, in block diagram form, the remap process of the present invention.

FIGS. 8 and 9 illustrate the portion of the invention which addresses the problem of post-synthesis netlists which may be incompatible with test benches created for pre-synthesis HDL source code.

An HDL design is imported and a waveform description of the stimulus and expected response are drawn. The waveform may be exported as a complete, timing constrained test bench. Once the design is synthesized, a post synthesis HDL netlist results. The netlist is then re-associated with the waveform description, the waveform is updated, and the post-synthesis compatible test bench is exported.

The Remap Process

During remap, port order of the post synthesis netlist is maintained. Signals with identical names and attributes in the behavioral and netlist HDL are stored in a list. Next, signals with identical names but different attributes are padded, scaled, or re-assigned and moved to the new list. If signals remain in the original and netlist lists, then the signals are remapped where applicable. Remaining signals in the original list are dropped, and new signals in the netlist list are saved.

During the remap process, the user is asked for each signal in question, and which old signal the new signal should map to. This occurs when signal names are changed by synthesis, or when signals are added during synthesis. When signal types are remapped, the bounding ranges are used to ensure the compatibility of values. When vectors are scaled to smaller vectors, the user is asked which bits to drop. Bi-directional signals converted to unidirectional have the unused components dropped.

Once remapping is complete, the waveform can be exported as a timing-constrained test bench, which simulates with the post-synthesis netlist. The testbench simulates on any standard HDL simulator, and the results can be back annotated to the waveform for comparison, highlighting of erroneous results, or updating of the waveform for future export as the expected values.

In summary, a computer system has been described that blends entry and display of timing requirements in order to automate the entry, modification, analysis, and generation of test benches from HDL descriptions.

The instant invention has been shown and described herein in what is considered to be the most practical and preferred embodiment. It is recognized, however, that departures may be made therefrom within the scope of the invention and that obvious modifications will occur to a person skilled in the art.

What is claimed is:

1. A computer system for constructing HDL test benches based upon HDL descriptions of electrical circuits, comprising:
means for generating and modifying said HDL data descriptions;
a computer including a monitor and memory storage means, said memory storage means containing instructions for displaying, on said monitor, a spreadsheet comprised of timing waveforms superimposed on an array of cells containing time-varying signal data patterns, wherein said waveforms and said data patterns correspond to said HDL descriptions and are simultaneously displayed on said monitor;
means for modifying said waveforms and said signal data patterns; and
means for automatically translating said waveforms into a complete HDL test bench file, said test bench file being fully compatible with industry-standard HDL simulators.

2. The computer system of claim 1 wherein said spreadsheet comprises rows and columns, said rows representing signal names and said columns representing cell values of said time varying signal data patterns, wherein said waveforms are superimposed upon said cell values.

3. The computer system of claim 1 wherein said signal data patterns are represented in binary form.

4. The computer system of claim 1 wherein said signal data patterns are represented in hexadecimal form.

5. The computer system of claim 1 wherein said signal data patterns are represented in decimal form.

6. The computer system of claim 1 wherein said waveforms are automatically revised to correspond to updates in said HDL descriptions.

7. The computer system of claim 1 wherein said means for modifying said waveforms and said signal data patterns is via one or more click events initiated by the user.

8. The computer system of claim 2 wherein if a user does not manually enter a cell value in a column, said cell value in said column is identical to the cell value in the column immediately proceeding said column but is not displayed therein.

9. The computer system of claim 1 further comprising means for updating said waveforms subsequent to simulation of said test bench by said HDL simulator.

10. A computer-aided method for constructing HDL test benches based upon HDL descriptions of electrical circuits, comprising the steps of:
generating and modifying said HDL description;
providing a computer including a monitor and memory storage means;
displaying on said monitor, a spreadsheet comprised of timing waveforms superimposed on an array of cells containing time-varying signal data patterns, wherein said waveforms and said data patterns correspond to said HDL descriptions and are simultaneously displayed on said monitor;
modifying signal waveforms and said data patterns; and
translating, automatically, said waveforms into a complete HDL test bench file, said test bench file being fully compatible with industry-standard HDL simulators.

11. The computer-aided method of claim 10 wherein said spreadsheet comprises rows and columns, said rows representing signal names and said columns representing cell values of said time varying signal data patterns, wherein said waveforms are superimposed upon said cell values.

12. The computer-aided method of claim 10 wherein said signal data patterns are represented in binary form.

13. The computer-aided method of claim 10 wherein said signal data patterns are represented in hexadecimal form.

14. The computer-aided method of claim 10 wherein said signal data patterns are represented in decimal form.

15. The computer-aided method of claim 10 wherein said waveforms are automatically modified to correspond to updates in said HDL descriptions.

16. The computer-aided method of claim 10 wherein said modifying said signal waveforms and said signal data patterns is via one or more click events initiated by the user.

17. The computer-aided method of claim 11 wherein if a user does not manually enter a cell value in a column, said cell value in said column is identical to the cell value in the column immediately proceeding said column but is not displayed therein.

18. The computer-aided method of claim 10 further comprising means for updating said waveforms subsequent to simulation of said test bench by said HDL simulator.

19. A computer program stored in a computer-readable medium, said computer program causing said computer to perform a method of constructing HDL test benches based upon HDL descriptions of electrical circuits, said method comprising the steps of:
generating and modifying said HDL description;
providing a computer including a monitor;
displaying on said monitor, a spreadsheet comprised of timing waveforms superimposed on an array of cells containing time-varying signal data patterns, wherein said waveforms and said data patterns correspond to said HDL descriptions and are simultaneously displayed on said monitor;
modifying signal waveforms and said data patterns; and
translating, automatically, said waveforms into a complete HDL test bench file, said test bench file being fully compatible with industry-standard HDL simulators.

20. The computer program of claim 19 wherein said spreadsheet comprises rows and columns, said rows representing signal names and said columns representing cell values of said time varying signal data patterns, wherein said waveforms are superimposed upon said cell values.

21. The computer program of claim 19 wherein said signal data patterns are represented in binary form.

22. The computer program of claim 19 wherein said signal data patterns are represented in hexadecimal form.

23. The computer program of claim 19 wherein said signal data patterns are represented in decimal form.

24. The computer program of claim 19 wherein said waveforms are automatically revised to correspond to updates in said HDL descriptions.

25. The computer program of claim 19 wherein said modifying said signal waveforms and said signal data patterns is via one or more click events initiated by the user.

26. The computer program of claim 19 wherein if a user does not manually enter a cell value in a column, said cell value in said column is identical to the cell value in the column immediately proceeding said column but is not displayed therein.

27. The computer program of claim 19 further comprising means for updating said waveforms subsequent to simulation of said test bench by said HDL simulator.

\* \* \* \* \*